US006868514B2

(12) United States Patent
Kubo et al.

(10) Patent No.: US 6,868,514 B2
(45) Date of Patent: Mar. 15, 2005

(54) FEC FRAME STRUCTURING METHOD AND FEC MULTIPLEXER

(75) Inventors: Kazuo Kubo, Tokyo (JP); Hideo Yoshida, Tokyo (JP); Hiroshi Ichibangase, Tokyo (JP); Hidenori Taga, Tokyo (JP); Eiichi Shibano, Tokyo (JP); Tadami Yasuda, Tokyo (JP)

(73) Assignees: Mitsubishi Denki Kabushiki Kaisha, Tokyo (JP); KDD Submarine Cable Systems Inc., Tokyo (JP)

( * ) Notice: Subject to any disclaimer, the term of this patent is extended or adjusted under 35 U.S.C. 154(b) by 272 days.

(21) Appl. No.: 09/890,858

(22) PCT Filed: Dec. 6, 2000

(86) PCT No.: PCT/JP00/08635

§ 371 (c)(1),
(2), (4) Date: Oct. 9, 2001

(87) PCT Pub. No.: WO01/43291

PCT Pub. Date: Jun. 14, 2001

(65) Prior Publication Data

US 2002/0129313 A1 Sep. 12, 2002

(30) Foreign Application Priority Data

Dec. 7, 1999 (JP) .......................................... 11-348084

(51) Int. Cl.[7] .............................................. H03M 13/29
(52) U.S. Cl. ....................................... 714/755; 714/776
(58) Field of Search ................................. 714/755, 776

(56) References Cited

U.S. PATENT DOCUMENTS 5,392,299 A    2/1995  Rhines et al. .............. 371/37.5
5,574,717 A  * 11/1996  Tomizawa et al. .......... 370/244
5,930,273 A  *  7/1999  Mukojima .................... 714/776
6,330,700 B1 * 12/2001  Morris et al. ................ 714/752
6,437,892 B1 *  8/2002  Fang et al. .................. 398/152
6,516,436 B1 *  2/2003  Dave et al. .................. 714/753

FOREIGN PATENT DOCUMENTS

EP      0984575 A2 *  8/1999
GB      A2275393       8/1994
JP      A61242426     10/1986

OTHER PUBLICATIONS

Sab et al., ECOC 26–30, pp. II–290–291 (1999).
ITU–T Recommendation G.975, 8 pages (1996).

* cited by examiner

Primary Examiner—Stephen M. Baker
(74) Attorney, Agent, or Firm—Birch, Stewart, Kolasch & Birch, LLP

(57) ABSTRACT

In an FEC frame structuring method, and an FEC multiplexer, the order of information is changed by a first interleaving circuit 32, a first error correction code is generated by an RS (239, 223) coding circuit 33, the order is returned to the original order by a first deinterleaving circuit 34, and a second error correction code is generated by an RS (255, 239) coding means 5. The second error correction code is decoded by an RS (255, 239) decoding circuit 11 to correct errors in the information, the order of information is changed by a second interleaving circuit 35, the first error correction code is decoded by an RS (239, 223) decoding circuit 36 to correct residual errors in the information, and the order is returned to the original order by a second deinterleaving circuit 37.

15 Claims, 10 Drawing Sheets

FEC FRAME STRUCTURING METHOD AND FEC MULTIPLEXER

This application is the national phase under 35 U.S.C. § 371 of PCT International Application No. PCT/JP00/08635 which has an International filing date of Dec. 6, 2000, which designated the United States of America and was not published in English.

BACKGROUND OF THE INVENTION

1. Technical Field

This invention relates to an FEC structuring method and an FEC multiplexer, designed to realize long-haul and large-capacity transmission by correcting a bit error caused by the degradation of optical SNR based on forward error correction (FEC) in an optical transmission system.

2. Background Art

FIG. 1 is a schematic diagram showing a conventional FEC multiplexer, for example one presented in accordance with ITU-T Recommendation G.975. In the drawing, a reference numeral 1 denotes a first demultiplexing circuit for demultiplexing 2.5 Gbit/s STM-16 data into 16 parallel 156 Mbit/s data; and 2 a second demultiplexer for demultiplexing the 16 parallel 156 Mbit/s data into 128 parallel 19 Mbit/s data. A reference numeral 3 denotes a first speed conversion circuit for adding redundant information and overhead information regions to the 128 parallel 19 Mbit/s data, and increasing a transmission speed to 21 Mbit/s by an amount accommodating the addition of the redundant information and overhead information regions; and 4 an overhead insertion circuit for inserting overhead information, e.g., frame alignment information, necessary for the operation and maintenance of the optical transmission system, into the overhead information region. A reference numeral 5 denotes an RS (255,239) coding circuit, represented by Reed-Solomon (RS) code, for generating error correction codes for the overhead information and the STM-16 data, and storing redundant information thereof in the redundant information region; 6 a first multiplexer for multiplexing the STM-16 data having the overhead information and the error correction codes added thereto into 16 parallel 167 Mbit/s data; and 7 a second multiplexing circuit for multiplexing the 16 parallel 167 Mbit/s into 2.66 Gbit/s FEC frame.

A reference numeral 8 denotes a third demultiplexing circuit for demultiplexing the 2.66 Gbit/s FEC frame, which has been multiplexed by the second multiplexing circuit 7 and transmitted through an optical transmission path, into 16 parallel 167 Mbit/s data: and 9 a fourth demultiplexing circuit for demultiplexing the 16 parallel 167 Mbit/s data into 128 parallel 21 Mbit/s data. A reference numeral 10 denotes a frame alignment circuit for detecting the head position of the 128 parallel 21 Mbit/s data according to the overhead information of the overhead information region added to the 128 parallel 21 Mbit/s data; and 11 an RS (255,239) decoding circuit for decoding the 128 parallel 21 Mbit/s data, detecting a data error in the FEC frame according to the decoding of the error correction codes and correcting the data into original correct data. A reference numeral 12 denotes an overhead separation circuit for separating the overhead information from the overhead information region of the 128 parallel 21 Mbit/s data; 13 a second speed conversion circuit for eliminating the redundant information and overhead information regions from the 128 parallel 21 Mbit/s data, and reducing a transmission speed to 19 Mbit/s by an amount accommodating the elimination of the redundant information and overhead information regions; 14 a third multiplexing circuit for multiplexing the 128 parallel 19 Mbit/s data to 16 parallel 156 Mbit/s data; and 15 a fourth multiplexing circuit for multiplexing the 16 parallel 156 Mbit/s data into 2.5 Gbit/s STM-16 data.

In FIG. 1, the first demultiplexing circuit 1 demultiplexes 2.5 Gbit/s ASTM-16 data into 16 parallel 156 Mbit/s. The second demultiplexing circuit 2 demultiplexes the 16 parallel 156 Mbit/s data into 128 parallel 19 Mbit/s data. The first speed conversion circuit 3 adds redundant information and overhead information regions to the 128 parallel 19 Mbit/s data, increases a transmission speed by an amount accommodating the addition of the redundant information and overhead information regions, and converts the data into 128 parallel 21 Mbit/s data. The overhead insertion circuit 4 inserts overhead information, e.g., frame alignment information or the like, necessary for the operation and maintenance of the optical transmission system, into the overhead information region. The RS (255,239) coding circuit 5 generates error correction codes for the overhead information and the STM-16 data, and stores the redundant information thereof in the redundant information region. The first multiplexing circuit 6 multiplexes the overhead information and the STM-16 data having the redundant information added thereto into 16 parallel 167 Mbit/s data. Further, the second multiplexing circuit 7 multiplexes the 16 parallel 167 Mbit/s data into a 2.66 Gbit/s FEC frame, and transmits the data to the optical transmission path.

The third demultiplexing circuit 8 demultiplexes the 2.66 Gbit/s FEC frame obtained by the multiplexing carried out by the second multiplexing circuit 7 and transmitted through the optical transmission path, into 16 parallel 167 Mbit/s data. Then, the fourth demultiplexing circuit 9 demultiplexes the 16 parallel 167 Mbit/s data into 128 parallel 21 Mbit/s data. The frame alignment circuit 10 detects the head position of the 128 parallel 21 Mbit/s data according to the overhead information of the overhead information region added to the 128 parallel 21 Mbit/s data. The RS (255,239) decoding circuit 11 decodes the 128 parallel 21 Mbit/s data, detects data errors in the FEC frame according to the decoding of the error correction circuit using the added redundant information, and corrects the data into original correct data. The overhead separation circuit 12 separates the overhead information from the overhead information region of the 128 parallel 21 Mbit/s data. The second speed conversion circuit 13 erases the redundant information and overhead information regions from the 128 parallel 21 Mbit/s data, reduces a transmission speed to 19 Mbit/s by an amount accommodating the erasure of the redundant information and overhead information regions. The third multiplexing circuit 14 multiplexes the 128 parallel 19 Mbit/s into 16 parallel 156 Mbit/s data. Then, the fourth multiplexing circuit 15 multiplexes the 16 parallel 156 Mbit/s data into 2.5 Gbit/s STM-16 data.

FIG. 2 is a structural view showing an FEC frame outputted from the overhead insertion circuit. FIG. 3 is a structural view showing FEC frames outputted from the RS (255,239) coding circuit and the second multiplexing circuit.

As shown in FIG. 2, the FEC frame outputted from the overhead insertion circuit 4 is structured of subframes 1 to 128 including 1 byte of overhead information, 238 bytes of STM-16 data, and a 16 bytes of RS (255,239) redundant information. As shown in FIG. 3, by the RS (255,239) coding circuit 5, error correction coding is executed for every 8 subframes. For example, in the subframes 1 to 8, redundant information symbols ER0-0 to ER0-15 are computed for the overhead information and the STM-16 data, and stored in the 16-bit RS (255,239) redundant information region. In addition, the FEC frame outputted from the second multiplexing circuit 7 is generated by sequentially multiplexing the subframes 1 to 128.

Here, f is a given natural number, indicating the number of times of multiplexing for each of the redundant information symbols ER0-0 to ER0-15. In each of FIGS. 2 and 3, the example of f=16 is shown.

In the described FEC frame, the FEC frame outputted from the second demultiplexing circuit 2 is 238 bytes of STM-16 data. By the first speed conversion circuit 3, the overhead and redundant information regions composed of 1 byte of overhead information and 16 bytes of RS (255,239) redundant information is added, and a transmission speed is increased by an amount accommodating the addition of the redundant information and overhead information regions. Accordingly, the transmission speed is increased by 255/238 times more than that of the original STM-16 data, and the transmission speed of the FEC frame is changed from 2.5 Gbit/s to 2.6 Gbit/s.

The FEC frame having the foregoing structure enables bit errors to be corrected. Thus, despite an optical transmission system having degraded optical SNR, a high-quality service can be provided. It is therefore possible to build a long-haul or large-capacity optical transmission system.

In the FEC frame structure shown in each of FIGS. 2 and 3, by shortening the STm-16 data in the subframe from 238 bytes to 110 bytes, and setting RS (255,239) error correction coding to be RS (127,111) error correction coding, a ratio of error correction coding to target information is increased. Thus, it is possible to enhance an error correction capability.

Since the conventional FEC frame structuring method and FEC multiplexer are constructed in the foregoing manner, if the transmission distance of the optical transmission path is long, or if the number of wavelengths is increased in a wavelength multiplexing system, optical SNR is greatly degraded. To compensate for this degradation, correction capacity can be increased to a certain extent, for example by increasing the ratio of error correction code to original information. However, the increased ratio of the error correction code to the original information necessitates a further increase in the transmission speed by the first speed conversion circuit 3. For example, in the RS (127,111) error correction coding, the transmission speed of the FEC frame is 2.89 Gbit/s, larger by 127/110 times than that of STM-16 data set to 2.5 Gbit/s, increasing the degradation amount of an optical transmission characteristic. Thus, even when the ratio of the error correction code to the original information was increased, it was impossible to build a long-haul and large-capacity optical transmission system having a predetermined quality.

The present invention was made to solve the foregoing problems. Objects of the invention are to provide an FEC frame structuring method and an FEC multiplexer, capable of increasing a transmission speed even when a ratio of an error correction code to information is increased, and greatly enhancing an error correction capability even when the degradation amount of an optical transmission characteristic is increased.

DISCLOSURE OF THE INVENTION

In accordance with the present invention, there is provided an FEC frame structuring method, comprising: a first error correction code generation step of generating first error correction codes by encoding information in n subframes in units of m subframes, and adding redundant information for the generated first error correction codes; an interleaving step of dividing the n subframes encoded in the first error correction codes, and interleaving information for units of n/m subframes by l times; a second error correction code generation step of generating second error correction codes by encoding information in the first error correction codes, and adding redundant information for the generated second error correction codes; and an FEC frame generation step of generating an FEC frame by multiplexing the n subframes encoded in the second error correction codes by n times.

Since two kinds of error correction codes, first and second, having bits of information to be subjected to error correction coding, are added, by decoding these two kinds of error correction codes at a receiving side, a residual error unable to be corrected by one kind of error correction code can be corrected. Thus, it is possible to greatly enhance an error correction capability even when a ratio of an error correction code to information is increased, consequently increasing a transmission speed and the degradation amount of an optical transmission characteristic.

In accordance with the invention, there is provided an FEC frame structuring method, comprising: an interleaving step of dividing n subframes in units of m subframes, and interleaving information in units of n/m subframes by a number of times l to generate subframes; a first error correction code generation step of generating first error correction codes by encoding the information in each of the n subframes in units of m subframes and adding redundant information for the generated first error correction codes; a deinterleaving step of deinterleaving the n subframes encoded in the first error correction codes by l times, and returning the information interleaved in the interleaving step to the original order; a second error correction code generation step of generating second error correction codes by encoding the information in each of the first error correction codes, and adding redundant information for the generated second error correction codes; and an FEC frame generation step of generating an FEC frame by multiplexing each of the n subframes encoded in the second error correction code by n times.

Since two kinds of error correction codes, first and second, having bits of information to be subjected to error correction coding, are added, by decoding the two kinds of error correction codes at a receiving side, a residual error unable to be corrected by one kind of error correction code can be corrected. Thus, it is possible to greatly enhance an error correction capability even when a ratio of an error correction code to information is increased, consequently increasing a transmission speed and the degradation amount of an optical transmission characteristic.

In addition, since an FEC frame is structured by deinterleaving, in the deinterleaving step, the information interleaved in the interleaving step to return it to the original order. Thus, it is possible to transmit the FEC frame of the original information, the order thereof having not been changed.

According to the FEC frame structuring method of the invention, l is n/m.

Thus, since the number of times of interleaving is set equal to n/m (number of subframes in each interleaving unit), bit positions of information to be subjected to error correction coding are uniformly changed, and errors of information are more likely to be uniformly distributed. Thus, the error correction capability can be further enhanced, and the configuration of a device for generating an FEC frame by this FEC frame structuring method can be simplified and miniaturized.

According to another embodiment of the FEC frame structuring method of the invention, 1 is larger than n/m by k times, and with the number k of FEC frames set as one interleaving cycle, interleaving is executed by n/m times for different information of each FEC frame.

Thus, it is possible to further enhance the error correction capability without further increasing a rate of transmission.

According to the FEC frame structuring method of the invention, the first and second error correction codes are Reed-Solomon codes respectively represented by RS (q, r) and RS (p, q) (p, q and r are natural numbers, and p>q>r, p representing a code length of the second error correction code, q an information length of the second error correction code, and a code length of the first error correction code, and r an information length of the first error correction code).

Thus, it is possible to facilitate the structuring of an FEC frame capable of enhancing the error correction capability without further increasing the rate of the transmission according to the above-described condition.

In accordance with the invention, there is provided an FEC multiplexer, comprising: first error correction coding means for generating first error correction codes for parallel information, the order thereof having been changed by first interleaving means, and then storing redundant information for each first error correction code in a redundant information region; second error correction coding means for generating second error correction codes for the parallel information, which is rechanged to the original order by first deinterleaving means, and storing redundant information for each second error correction code in the redundant information region; second error correction decoding means for correcting errors of the parallel information by decoding each second error correction code using the redundant information of the second error correction code stored in the redundant information region, for the parallel information of an FEC frame transmitted through a transmission path; first error correction decoding means for correcting a residual error of the parallel information by decoding each first error correction code using the corresponding redundant information stored in the redundant information region, for the parallel information processed by second interleaving means; and second deinterleaving means for rechanging the order, changed by the second interleaving means, of the parallel information to an original order.

Thus, two kinds of error correction codes, first and second, with bit positions of information to be subjected to error correction coding switched by interleaving, are generated in the FEC frame transmitted through the optical transmission path. By decoding the two kinds of error correction codes at a receiving side, a residual error unable to be corrected by one kind of error correction code can be corrected. As a result, even when a ratio of error correction code to original information is increased, consequently increasing the transmission speed and the degradation amount of an optical transmission characteristic, it is possible to greatly enhance an error correction capability.

Moreover, since the information interleaved by the first interleaving means is deinterleaved by the first deinterleaving means, it is possible to transmit the FEC frame of original information, the order thereof having not been changed, to the optical transmission path.

According to the FEC multiplexer of the invention, error correction means including the second error correction decoding means, the second interleaving means, the first error correction decoding means, and the second deinterleaving means is connected in a multistage and cascaded manner.

Thus, by providing additional error correction means, without changing the structure of the FEC frame, it is possible to further enhance the error correction capability by repeating error correction for the two kinds of error correction codes by a number of times.

BEST MODES FOR CARRYING OUT THE INVENTION

Next, detailed description will be made of the preferred embodiments of the present invention with reference to the accompanying drawings.

First Embodiment

Figure 1:
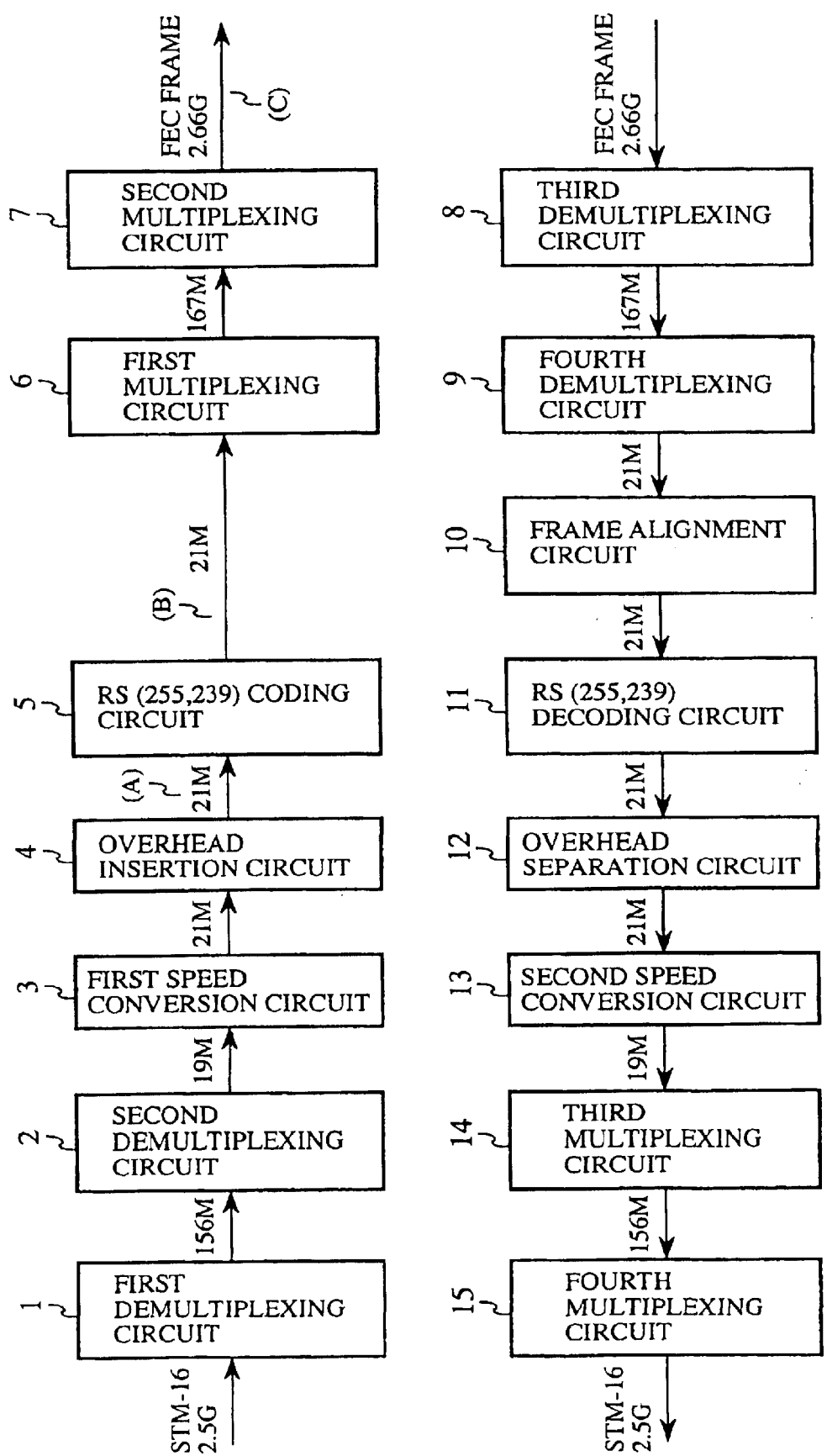
FIG. 1 is a schematic diagram showing a conventional FEC multiplexer.
Figure 2:
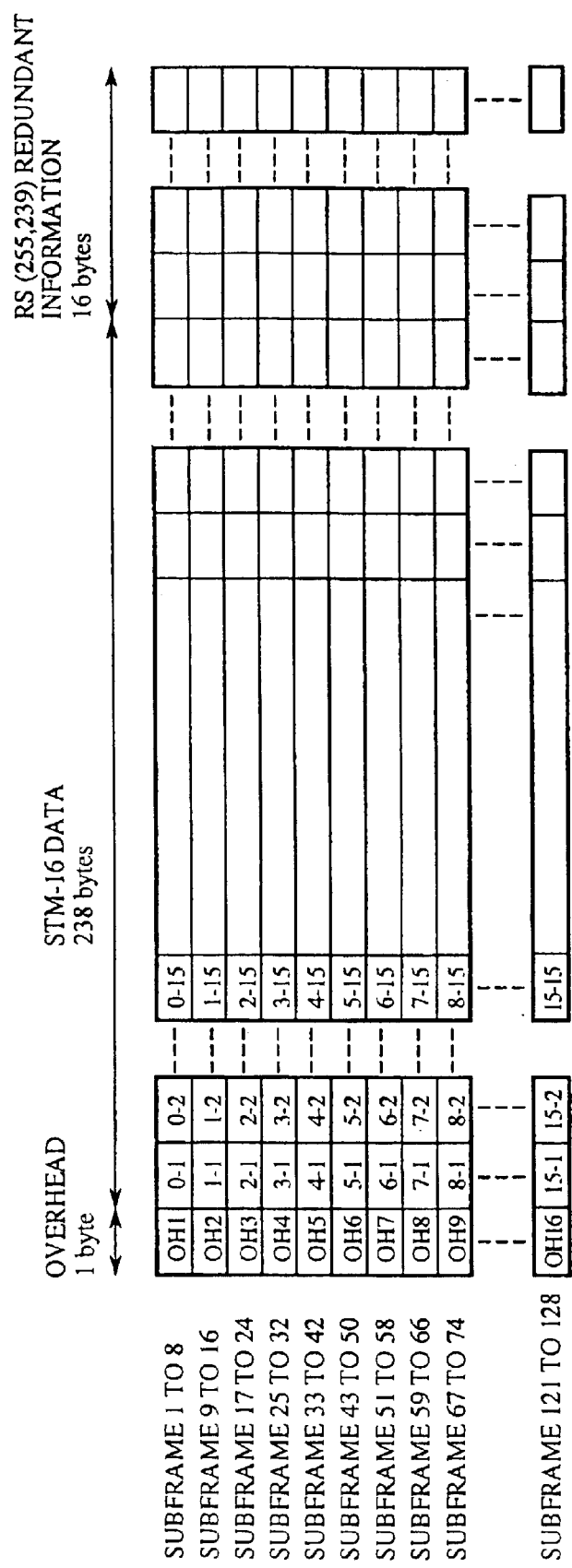
FIG. 2 is a structural view showing an FEC frame outputted from an overhead insertion circuit.
Figure 3:
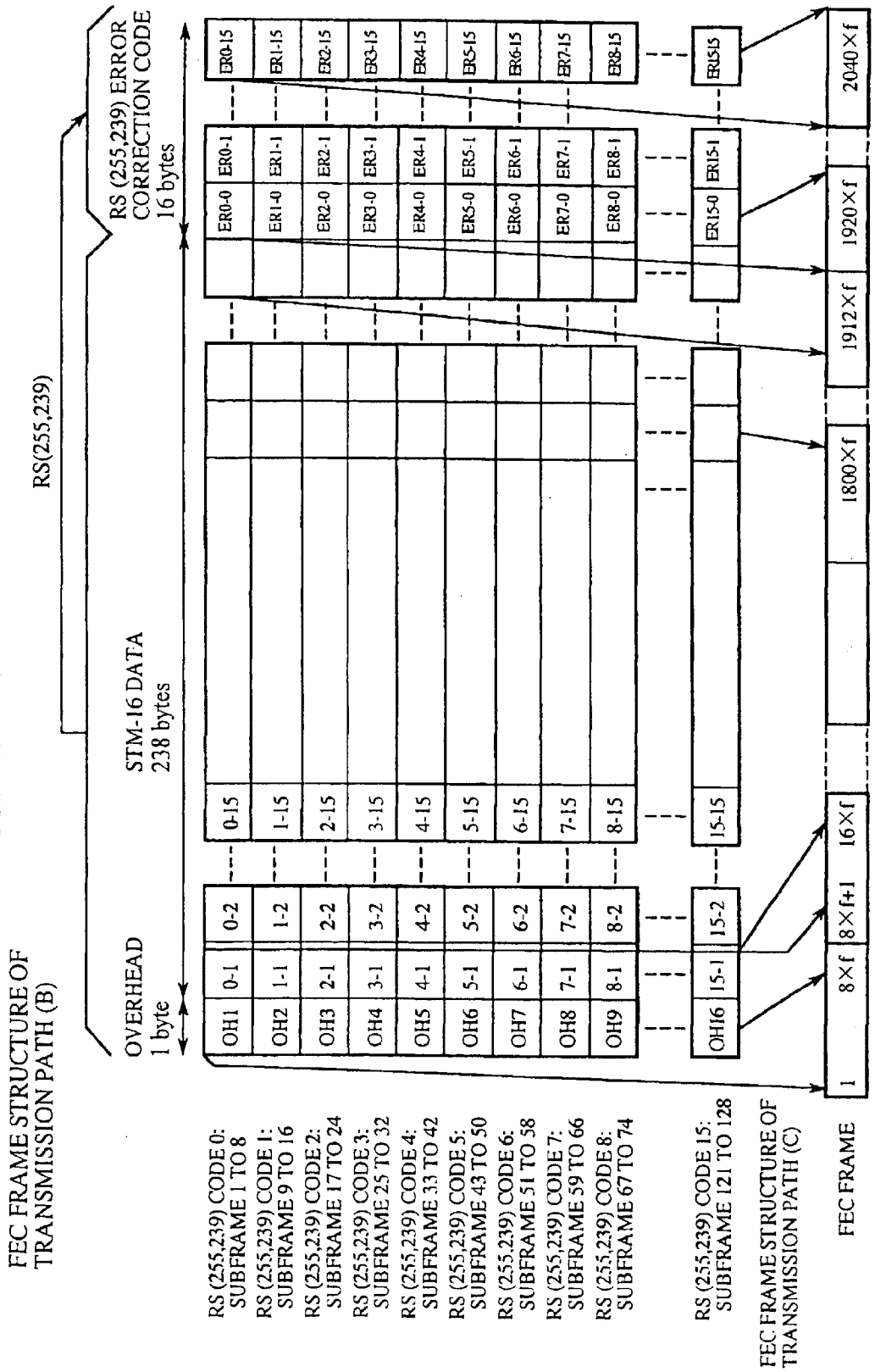
FIG. 3 is a structural view showing FEC frames outputted respectively from an RS (255,239) coding circuit and a second multiplexing circuit.
Figure 4:
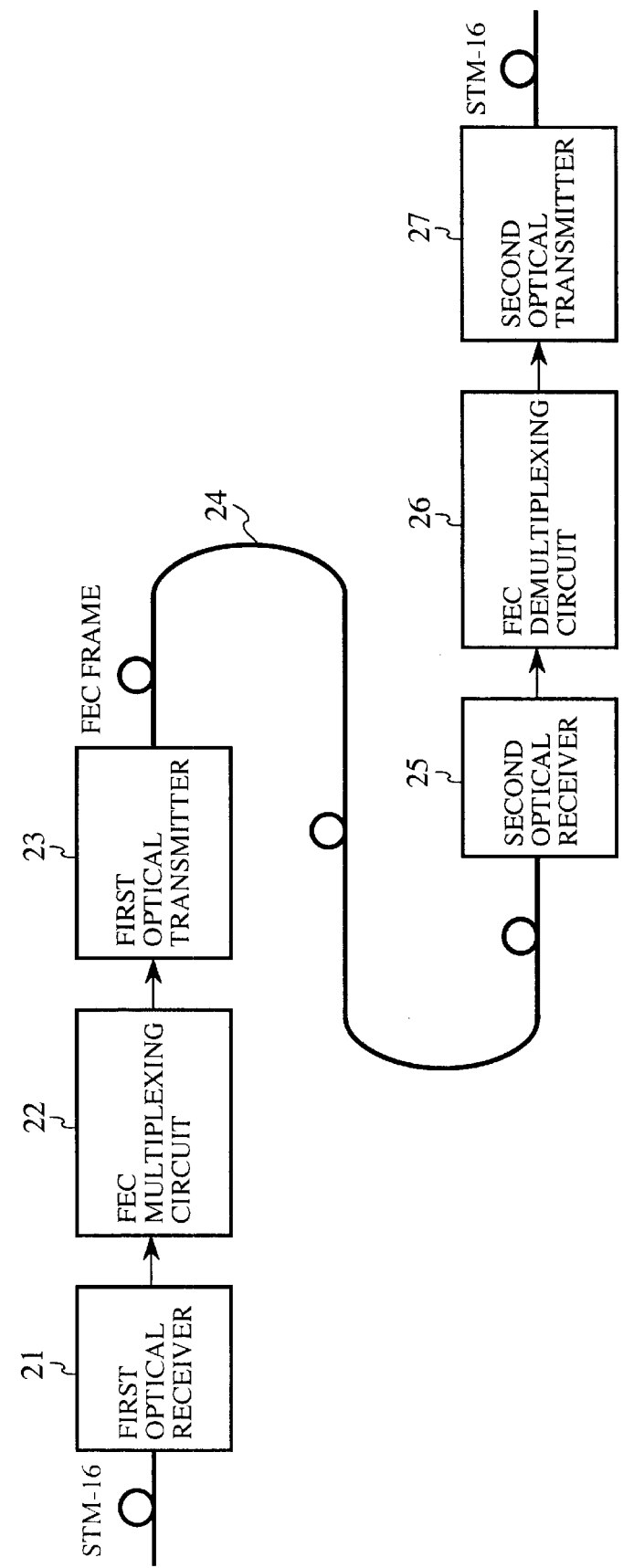
FIG. 4 is a schematic diagram showing an optical transmission system, to which an FEC frame structuring method and an FEC multiplexer according to a first embodiment of the invention are applied.

FIG. 4 is a schematic diagram showing an optical transmission system, to which an FEC frame structuring method and an FEC multiplexer according to the first embodiment of the invention are applied. In the drawing, a reference numeral 21 denotes a first optical receiver for receiving an STM-16 optical signal, and converting the optical signal into an electric signal; 22 an FEC multiplexing circuit (FEC demultiplexer) for demultiplexing the electric signal from the first optical receiver 21, executing the insertion of overhead information, error correction coding, and so on, and then executing multiplexing again to structure an FEC frame; and 23 a first optical transmitter for converting the FEC frame into an optical signal. A reference numeral 24 denotes an optical transmission path for transmitting the FEC frame of the optical signal; 25 a second optical receiver for converting the FEC frame transmitted through the optical transmission path 24 from the optical signal into an electric signal; 26 an FEC demultiplexing circuit (FEC multiplexer) for demultiplexing the electric signal from the optical receiver 25, executing frame alignment of the FEC frame, decoding of error correction codes, separation of overhead information and so on, and then executing multiplexing again; and 27 a second optical transmitter for converting the electric signal from the FEC demultiplexing circuit 26 into an optical signal, and outputting the STM16 optical signal.

Figure 5:
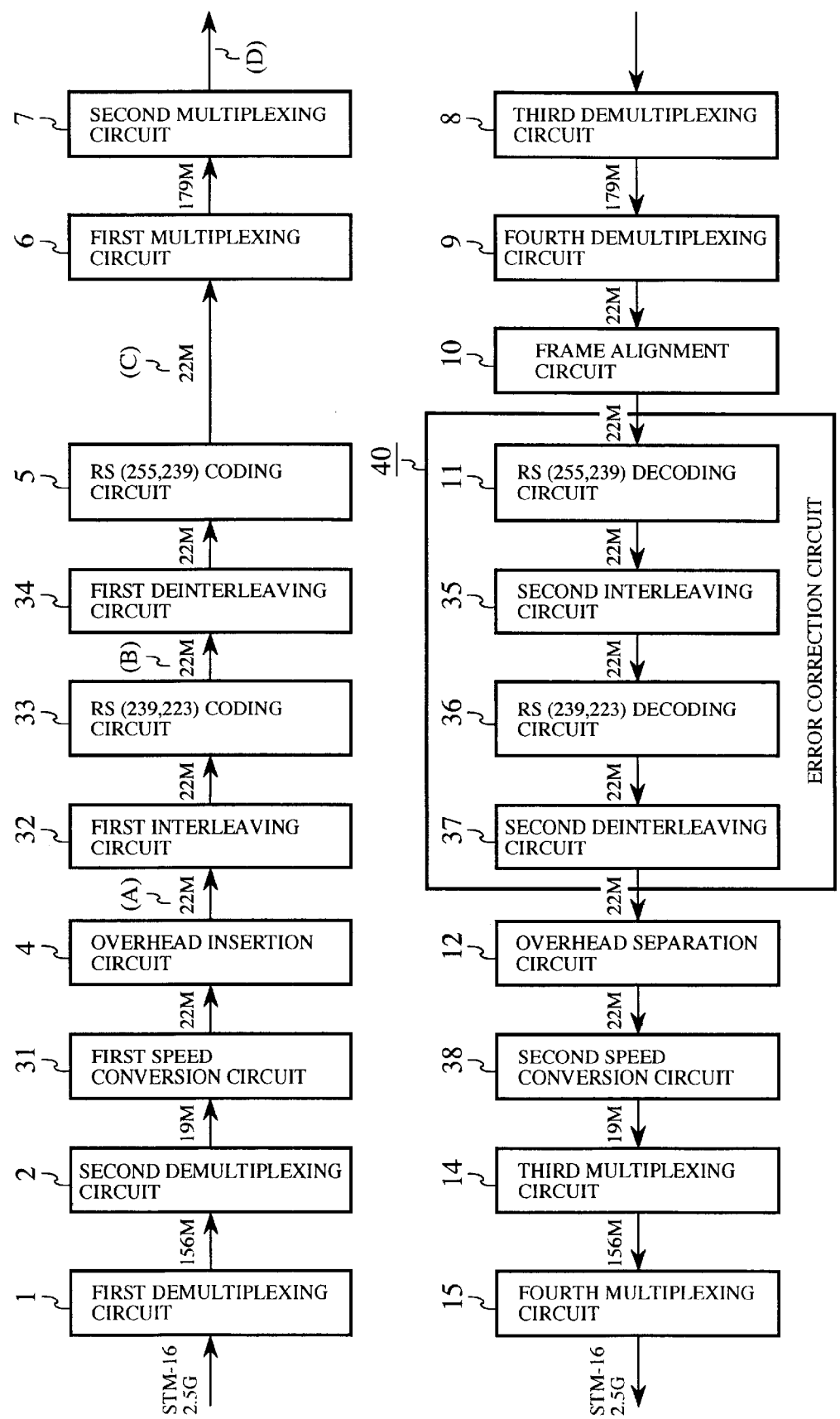
FIG. 5 is a schematic diagram showing an FEC multiplexer of the first embodiment of the invention.

FIG. 5 is a schematic diagram showing the FEC multiplexer of the first embodiment of the invention. In the drawing, the upper side shows the FEC multiplexing circuit 22 of FIG. 4, and the lower side shows the FEC demultiplexing circuit 26 of FIG. 4. In the drawing, a reference numeral 1 denotes a first demultiplexing circuit (first demultiplexing means) for demultiplexing 2.5 Gbit/s STM-16 data into 16 parallel 156 Mbit/s data; and 2 a second demultiplexing circuit (first demultiplexing means) for demultiplexing the 16 parallel 156 Mbit/s data into 128 parallel 19 Mbit/s data. A reference numeral 31 denotes a first speed conversion circuit (first speed conversion means) for adding overhead information and redundant information regions to the 128 parallel 19 Mbit/s data, and increasing a transmission speed to 22 Mbit/s by an amount accommodating the addition of the overhead information and redundant information regions; and 4 an overhead insertion circuit (overhead insertion means) for inserting overhead information, e.g., frame alignment information, necessary for the operation and maintenance of the optical transmission system, into the overhead information region. A reference numeral 32 denotes a first interleaving circuit (first interleaving means) for changing the order of the 128 parallel 22 Mbit/s data; and 33 an RS (239, 223) coding circuit (first error correction coding means) for executing RS (239, 223) error correction coding, and storing the redundant information of the error correction code in the redundant information region. A reference numeral 34 denotes a first deinterleaving circuit (first deinterleaving means) for returning the order of the 128 parallel 22 Mbit/s data, changed by the first interleaving circuit 32, to the original order; and 5 an RS (255, 239) coding circuit (second error correction coding means) for executing RS (255, 239) error correction coding, and storing the redundant information of the error correction code in the redundant information region. A reference numeral 6 denotes a first multiplexing circuit (first multiplexing means) for multiplexing the 128 parallel 22 Mbit/s data into 16 parallel 179 Mbit/s data; and 7 a second multiplexing circuit (first multiplexing means) for multiplexing the 16 parallel 179 Mbit/s data into 2.86 Gbit/s FEC frame.

A reference numeral 8 denotes a third demultiplexing circuit (second demultiplexing means) for demultiplexing the 2.86 Gbit/s FEC frame into 16 parallel 179 Mbit/s data; 9 a fourth demultiplexing circuit (second demultiplexing means) for demultiplexing the 16 parallel 179 Mbit/s data into 128 parallel 22 Mbit/s data; and 10 a frame alignment circuit (frame alignment means) for detecting the head position of the 128 parallel 22 Mbit/s data according to the overhead information stored in the overhead information region. A reference numeral 40 denotes an error correction circuit (error correction means), which includes: an RS (255, 239) decoding circuit (second error correction decoding means) 11 for decoding the 128 parallel 22 Mbit/s data, and correcting bit errors according to the decoding of the RS (255, 239) error correction code; a second interleaving circuit (second interleaving means) 35 for changing the order of the 128 parallel 22 Mbit/s data similarly to that of the first interleaving circuit 32; an RS (239, 223) decoding circuit (first error correction decoding means) 36 for decoding the 128 parallel 22 Mbit/s data excluding the RS (255, 239) redundant information, and correcting a bit error according to the decoding of the RS (239, 223) error correction code; and a second deinterleaving circuit (second deinterleaving means) 37 for returning the order of the 128 parallel 22 Mbit/s data, changed by the second interleaving circuit 35, to the original order. A reference numeral 12 denotes an overhead separation circuit (overhead separation means) for separating the overhead information from the overhead information region; and 38 a second speed conversion circuit (second speed conversion means) for removing the redundant information and overhead information regions from the 128 parallel 22 Mbit/s data, and reducing the transmission speed to 19 Mbit/s by an amount accommodating the removal of the redundant information and overhead information regions. A reference numeral 14 denotes a third multiplexing circuit (second multiplexing means) for multiplexing the 128 parallel 19 Mbit/s data into 16 parallel 156 Mbit/s data; and 15 a fourth multiplexing means (second multiplexing means) for multiplexing the 16 parallel 156 Mbit/s data into 2.5 Gbit/s STM-16 data.

In FIG. 4, the first optical receiver 21 receives an STM-16 optical signal, and converts the optical signal into an electric signal. The FEC multiplexing circuit 22 demultiplexes the electric signal obtained by the conversion, stores overhead information and redundant information of error correction codes in the overhead information and redundant information regions, respectively, and executing multiplexing again to structure an FEC frame. The first optical transmitter 23 converts the FEC frame into an optical signal, and sends the optical signal to the optical transmission path 24 made of an optical fiber. The second optical receiver 25 converts the optical signal of the FEC frame transmitted through the optical transmission path 24 into an electric signal. The FEC demultiplexing circuit 26 demultiplexes the electric signal obtained by the conversion, frame-synchronizes the FEC frame according to the overhead information stored in the overhead information region, decodes the error correction codes to correct bit errors, and then executes multiplexing again after the overhead and redundant information regions are eliminated. The second optical transmitter 27 converts the electric signal from the FEC demultiplexing circuit 26 into an optical signal, and outputs the STM-16 optical signal. In this case, since optical SNR is degraded because of the long-haul and large-capacity transmission of the optical signal on the optical transmission path 24, the FEC frame outputted from the second optical receiver 25 has a number of bit errors that have occurred. Such bit errors are corrected by the FEC demultiplexing circuit 26, and a bit error rate of the STM-16 optical signal outputted from the second optical transmitter 27 is greatly improved. Thus, communication services having predetermined quality can be provided.

In the upper side of FIG. 5, i.e., in the FEC multiplexing circuit 22, the first demultiplexing circuit 1 demultiplexes 2.5 Gbit/s STM-16 data into 16 parallel 156 Mbit/s data, and the second demultiplexing circuit 2 demultiplexes the 16 parallel 156 Mbit/s data into 128 parallel 19 Mbit/s data. The first speed conversion circuit 31 adds redundant information and overhead information regions to the 128 parallel 19 Mbit/s data, and increases a transmission speed to 22 Mbit/s by an amount accommodating the addition of these regions. The overhead insertion circuit 4 inserts overhead information, e.g., frame alignment information, necessary for the operation and maintenance of the optical transmission system, into the overhead information region. The first interleaving circuit 32 changes the order of the 120 parallel 22 Mbit/s data, and the RS (239, 223) coding circuit 33 executes RS (239, 223) error correction coding, and stores the redundant information of each error correction code in the corresponding redundant information region. The first deinterleaving circuit 34 returns the order of the 128 parallel 22 Mbit/s data, changed by the first interleaving circuit 32, to the original order. The RS (255, 239) coding circuit 5 executes RS (255, 239) error correction coding, and stores the redundant information of each error correction code in the corresponding redundant information region. The first multiplexing circuit 6 multiplexes the 128 parallel 22 Mbit/s data into 16 parallel 179 Mbit/s data, and the second multiplexing circuit 7 multiplexes the 16 parallel 179 Mbit/s data, and outputs a 2.86 Gbit/s FEC frame.

In the lower side of FIG. 5, i.e., in the FEC demultiplexing circuit 26, the third demultiplexing circuit 8 demultiplexes the 2.8 Gbit/s FEC frame into 16 parallel 179 Mbit/s data, and the fourth demultiplexing circuit 9 demultiplexes the 16 parallel 179 Mbit/s data into 128 parallel 22 Mbit/s data. The frame alignment circuit 10 evaluates the overhead information stored in the overhead information region, and detects the head position of the 128 parallel 22 Mbit/s data. The RS (255, 239) decoding circuit 11 in the error correction circuit 40 decodes the 128 parallel 22 Mbit/s data, and correct bit errors according to the decoding of the RS (255, 239) error correction codes. The second interleaving circuit 35 changes the order of the 128 parallel 22 Mbit/s data similarly to that of the first interleaving circuit 32. The RS (239, 223) decoding circuit 36 decodes the 128 parallel 22 Mbit/s data excluding the RS (255, 239) redundant information, and corrects bit errors according to the decoding of the RS (239, 223) error correction code. The second deinterleaving circuit 37 returns the order of the 128 parallel 22 Mbit/s data, changed by the second interleaving circuit 35, to the original order. The overhead separation circuit 12 separates the overhead information from the overhead information region, and the second speed conversion circuit 38 removes the redundant information and overhead information regions from the 128 parallel 22 Mbit/s data, and reduces the transmission speed to 19 Mbit/s by an amount accommodating the removal of the redundant information and overhead information regions. The third multiplexing circuit 14 multiplexes the 128 parallel 19 Mbit/s data into 16 parallel 156 Mbit/s data. The fourth multiplexing circuit 15 multiplexes the 16 parallel 156 Mbit/s data, and outputs 2.5 Gbit/s STM-16 data.

Figure 6:
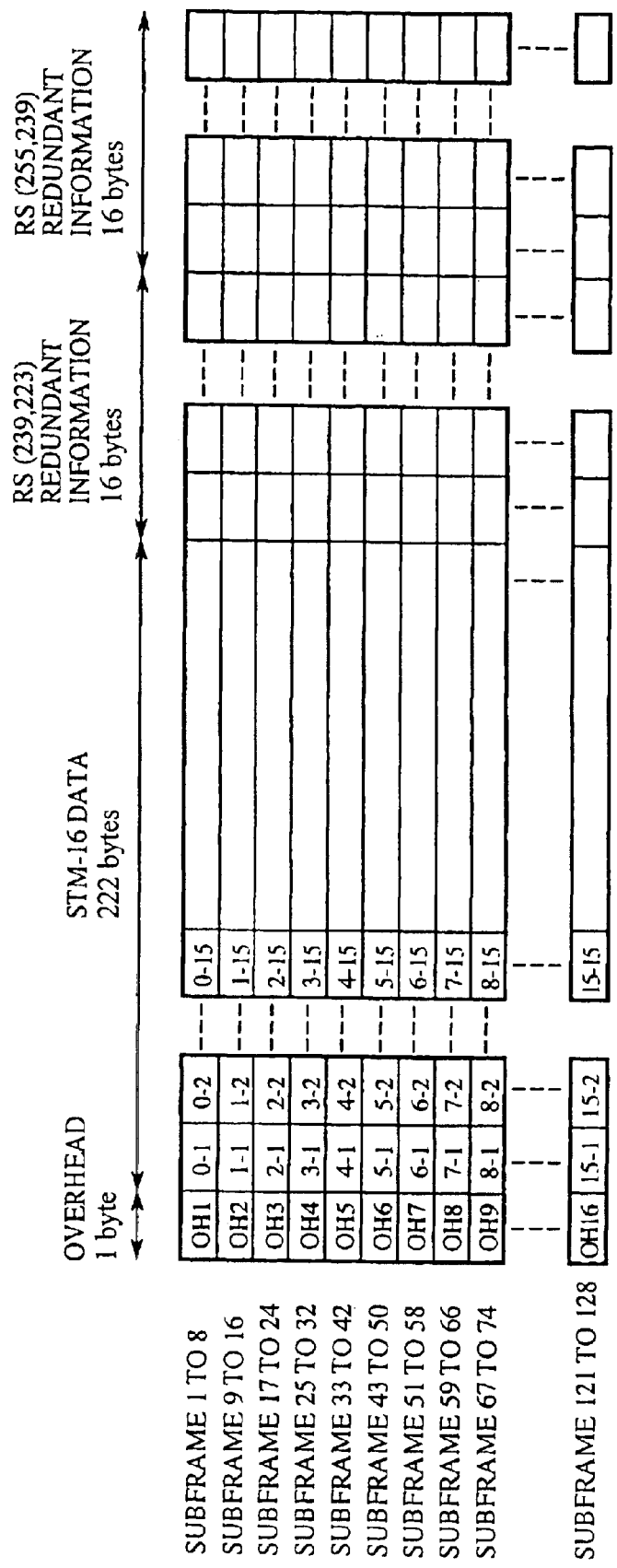
FIG. 6 is a structural view showing an FEC frame outputted from an overhead insertion circuit.
Figure 7:
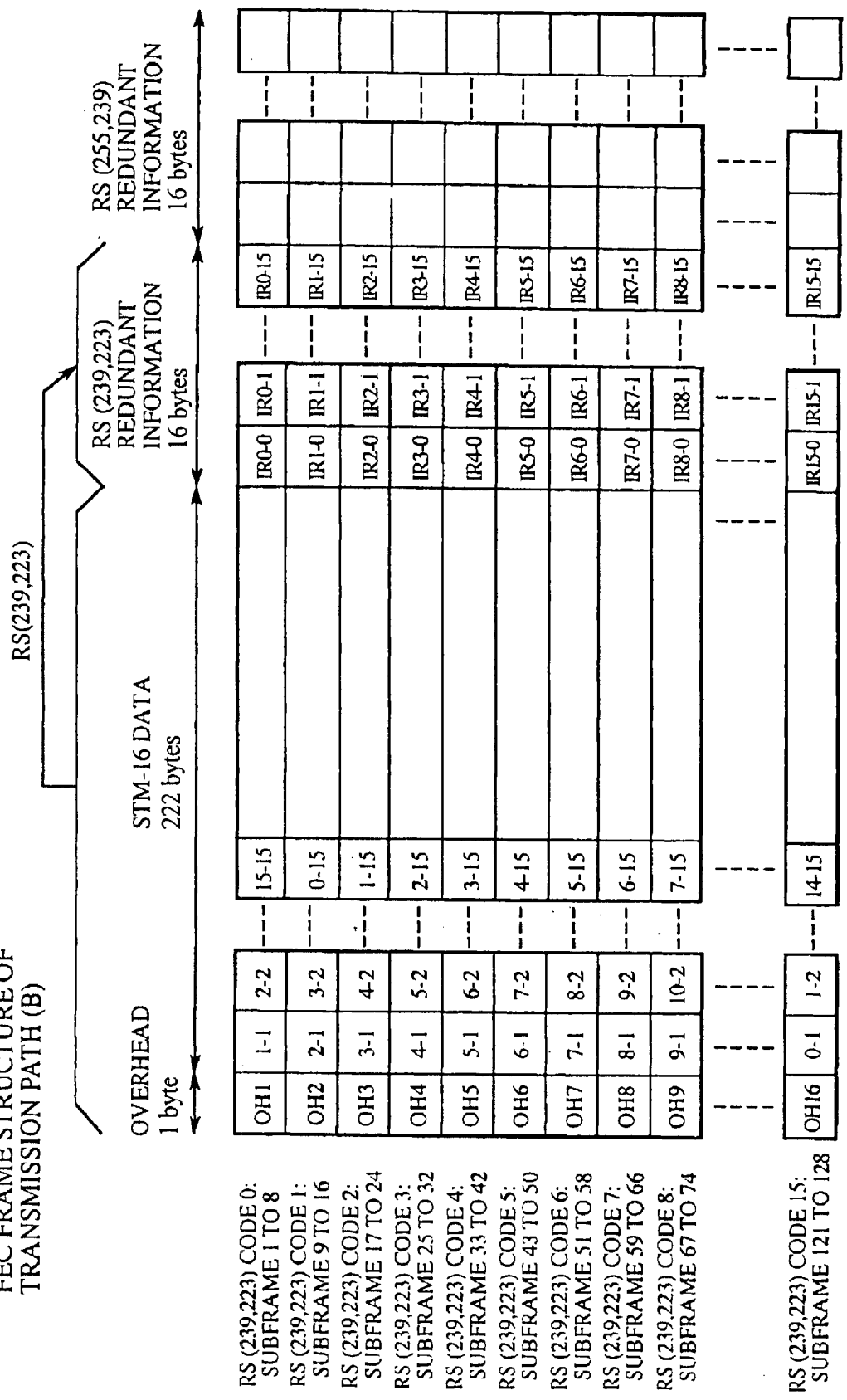
FIG. 7 is a structural view showing an FEC frame outputted from an RS (239,223) coding circuit.

FIG. 6 is a structural view showing an FEC frame outputted from the overhead insertion circuit; FIG. 7 a structural view showing an FEC frame outputted from the RS (239, 223) coding circuit; and FIG. 8 a structural view showing an FEC frame outputted from the RS (255, 239) coding circuit.

As shown in FIG. 6, the 128 parallel 22 Mbit/s data outputted from the overhead insertion circuit 4 is composed of subframes amounting to n in number (n=128) including 1 byte of overhead information, 222 bytes of STM-16 data, 16 bytes of RS (239, 223) redundant information, and 16 bytes of RS (255, 239) redundant information. In this case, it is assumed that the STM-16 data is set as transmission information, and the overhead information, the RS (239, 223) redundant information, and the RS (255, 239) redundant information are stored in the overhead and redundant information regions.

At the overhead insertion circuit 4, overhead information is stored in the overhead information region of each of the subframes 1 to 128. In FIG. 6, the subframes 1 to 128 are divided for every m (m=8) subframes, and bytes of overhead information OH 1 to OH 16 are stored in the overhead information regions of the subframes of n/m units (128/8=16).

At the first interleaving circuit 32, the 128 parallel 22 Mbit/s data shown in FIG. 6 is divided for every m (m=8) subframes as in the case of the 128 parallel 22 Mbit/s data shown in FIG. 7, and the order of the data for units of n/m subframes (128/8=16) is changed. Here, as an example of data order changing, the case of performing interleaving by l times (l=16) is shown, specifically, no changing in a first row, shifted up by one for every 8 subframes in a second row, shifted up by two in a third row, . . . , shifted up by fifteen in a sixteenth row, and shifted up by sixteen in a seventeenth row (equal to no changing).

The RS (239, 223) coding circuit 33 generates an RS (239, 223) error correction code for each unit of 8 subframes targeting the overhead information and the STM-16 data as in the case of the 128 parallel 22 Mbit/s data shown in FIG. 7, and stores the redundant information of each error correction code in the redundant information region of the corresponding RS (239, 223) error correction code area.

Figure 8:
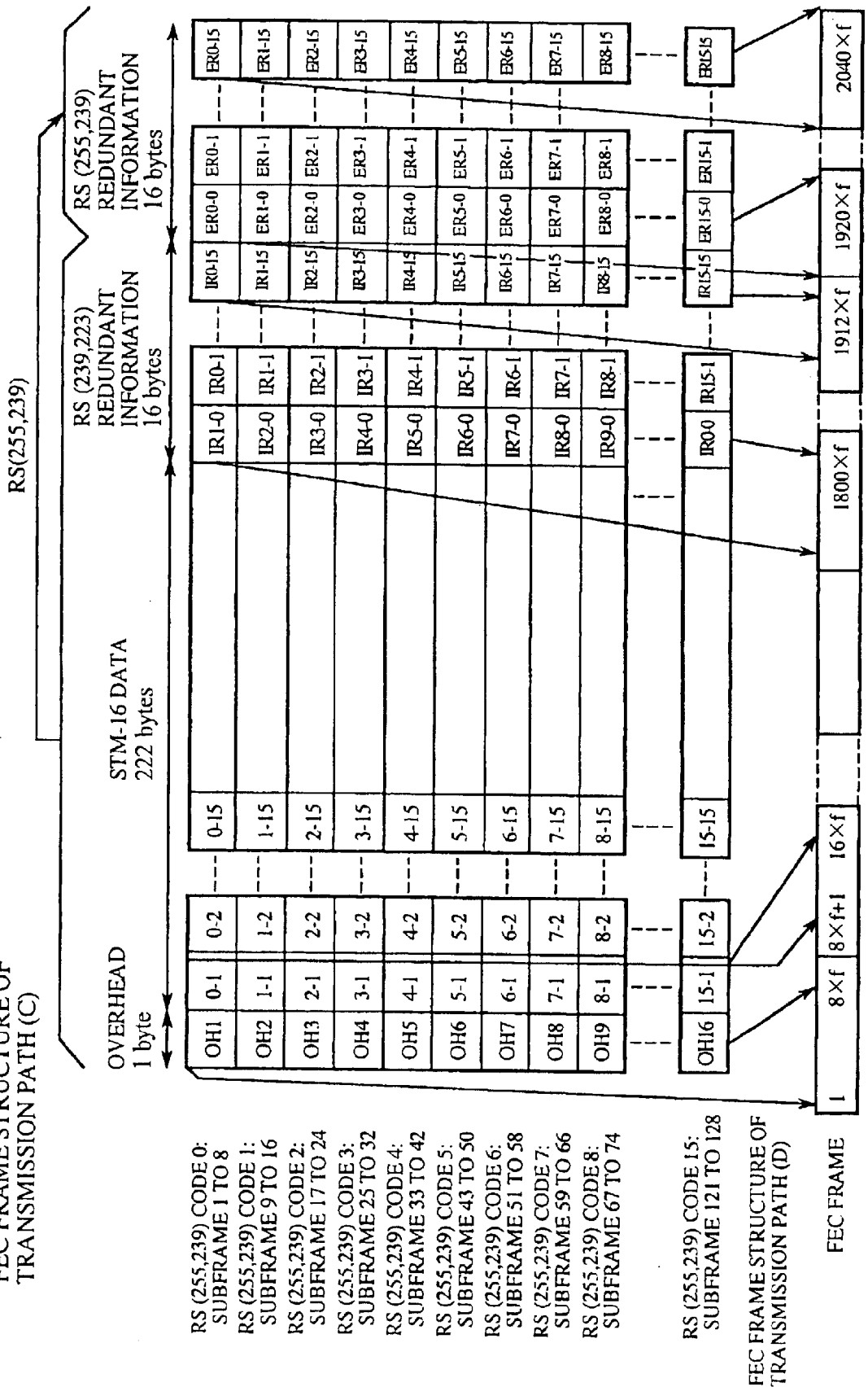
FIG. 8 is a structural view showing FEC frames outputted respectively from the RS (255,239) coding circuit and a second multiplexing circuit.

At the first deinterleaving circuit 34, for the 128 parallel 22 Mbit/s data shown in FIG. 7 as in the case of the 18 parallel 22 Mbit/s data shown in FIG. 8, the order of data is changed for every unit of 8 subframes in such a way as to return the data region of the STM-16 to the original order.

The RS (255, 239) coding circuit 5 generates an RS (255, 239) error correction code for each unit of 8 subframes corresponding to the overhead information, the STM-16 data and the RS (239, 223) redundant information as in the case of the 128 parallel 22 Mbit/s data shown in the upper side of FIG. 8, and stores the redundant information of the error correction code in the redundant information region of the RS (255, 239) error correction code.

The 128 parallel 22 Mbit/s data shown in the upper side of FIG. 8 is subjected to multiplexing by the first and second multiplexing circuits 6 and 7, and a 2.86 Gbit/s FEC frame shown in the lower side of FIG. 8 is structured. Here, f represents n/m (n/m=128/8=16).

In the FEC frame of the first embodiment, with respect to the 2.5 Gbit/s transmission speed of the original STM-16 data, a 33-byte length redundant information region is added to the 222 bytes of STM-16 data, and the transmission speed is increased by 255/222 times. Thus, the transmission speed of the FEC frame is set to 2.86 Gbit/s.

In the FEC demultiplexing circuit 26, the RS (255, 239) decoding circuit 11 executes RS (255, 239) error correction decoding for each unit of 8 subframes for the overhead information, the STM-16 data, the RS (239, 223) redundant information, and RS (255, 239) redundant information of the 128 parallel 22 Mbit/s data shown in the upper stage of FIG. 8, and then corrects bit errors in each of the overhead information, the STM-16 data, the RS (239, 223) redundant information, and the RS (255, 239) redundant information according to the decoding of the RS (255, 239) error correction code. In this case, if a number of bit errors exceeding the correction capability has occurred, then bit errors remain in the output data of the RS (255, 239) decoding circuit 11.

The second interleaving circuit 35 changes the order of the 128 parallel 22 Mbit/s data similarly to that of the first interleaving circuit 32. The RS (239, 223) decoding circuit 36 executes RS (239, 223) error correction decoding for each unit of 8 subframes for the overhead information, the STM-16 data and the RS (239, 223) redundant information of the 128 parallel 22 Mbit/s data shown in FIG. 7, and thereby corrects bit errors remaining in each code according to the decoding of the RS (239, 223) error correction code. The deinterleaving allows, for the RS (255, 239) error correction code and the RS (239, 223) error correction code, bit positions of information subjected to error correction coding to be switched, causing bit errors to more likely be dispersed between the codes. Therefore, the error correction capability can be greatly enhanced.

The second deinterleaving circuit 37 returns the order of the 128 parallel 22 Mbit/s data, changed by the second interleaving circuit 35, to the original order.

As described above, according to the first embodiment, in the FEC frame structuring method and the FEC multiplexer, two kinds of error correction coding are carried out, the first interleaving circuit 32, the first deinterleaving circuit 34, the second interleaving circuit 35 and the second deinterleaving circuit 37 are disposed, and the order of information is changed between the two kinds of error correction codes. Thus, compared with the structure provided by the conventional technology, an error correction capability can be greatly enhanced, and a longhaul and large-capacity optical transmission system can be built even when a transmission speed is increased to 2.86 Gbit/s. In addition, the first interleaving circuit 32 is disposed before the RS (239, 223) coding circuit 33 of the first stage, and the first deinterleaving circuit 34 is disposed before the RS (255, 239) coding circuit 5 of the next stage. Thus, the STM-16 data in the FEC frame can be transmitted without changing the order thereof.

Furthermore, the numbers of times of interleaving and deinterleaving (l=16) are set equal to the unit numbers (n/m=128/8=16) of interleaved and deinterleaved subframes. Thus, bit positions of information to be subjected to error correction coding are uniformly order-changed, and information errors are more likely to be uniformly dispersed. As a result, it is possible to further enhance the error correction capability, and to easily configure and miniaturize the FEC multiplexer.

Second Embodiment

Figure 9:
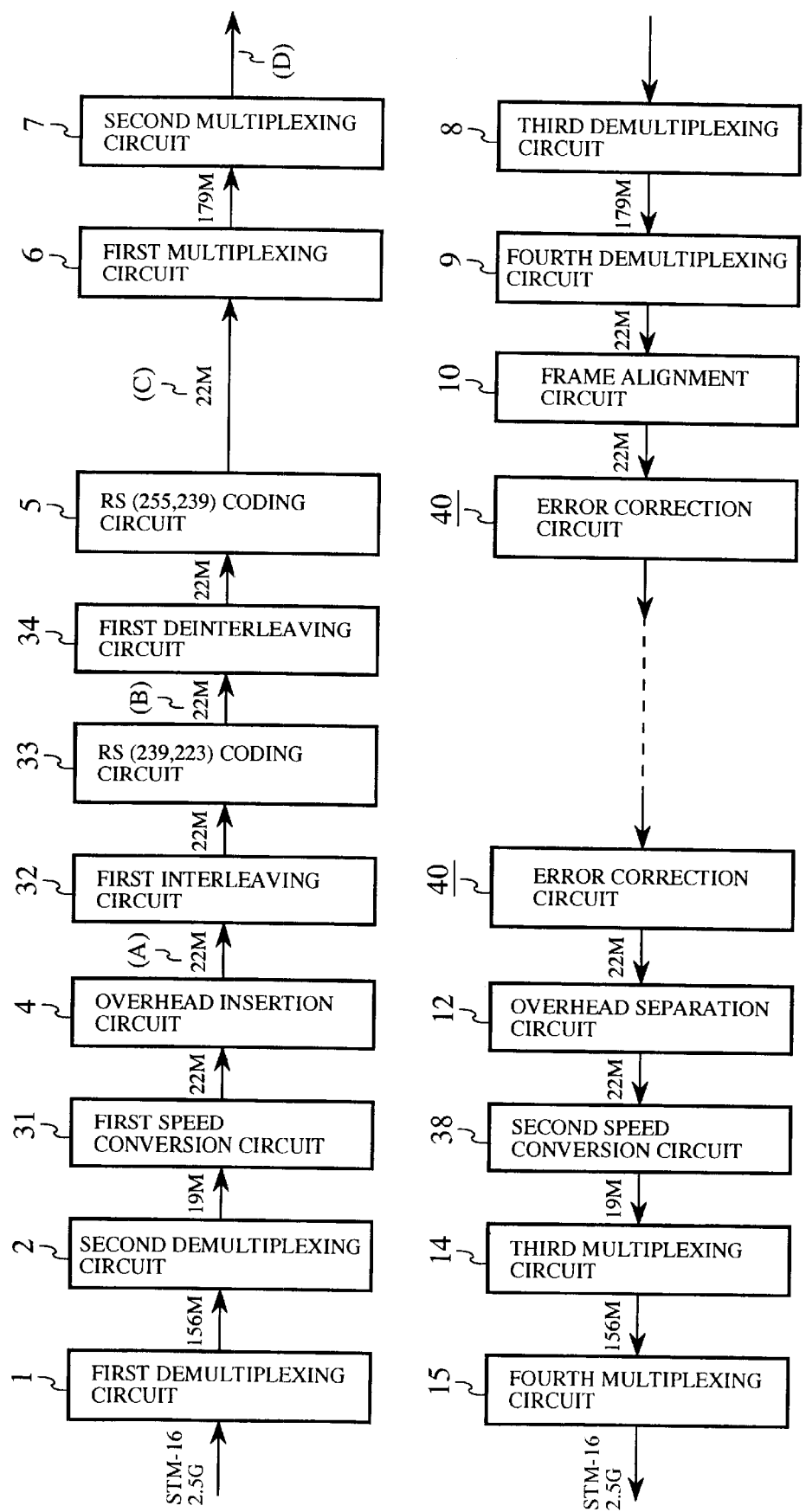
FIG. 9 is a schematic diagram showing an FEC frame multiplexer according to a second embodiment of the invention.

FIG. 9 is a schematic diagram showing an FEC multiplexer according to the second embodiment of the invention. This FEC multiplexer comprises multiple error correction circuits (error correction means) 40 connected in a multi-stage and cascaded manner. Each error correction circuit 40 includes: an RS (255, 239) decoding circuit 11; a second interleaving circuit 35; an RS (239, 223) decoding circuit 36; and second interleaving circuit 37.

In FIG. 9, the error correction circuits 40 are connected in the multistage and cascaded manner in the FEC demultiplexing circuit 26. According to the second embodiment, the operations of bit error correction are sequentially repeated for two kinds of error correction codes. Thus, the error correction capability can be further enhanced, and it is possible to build a long-haul and large-capacity optical transmission system without changing the configuration of the FEC frame or changing any hardware other than one for connecting the error correction circuits 40 in a multistage and cascaded manner.

Third Embodiment

Figure 10:
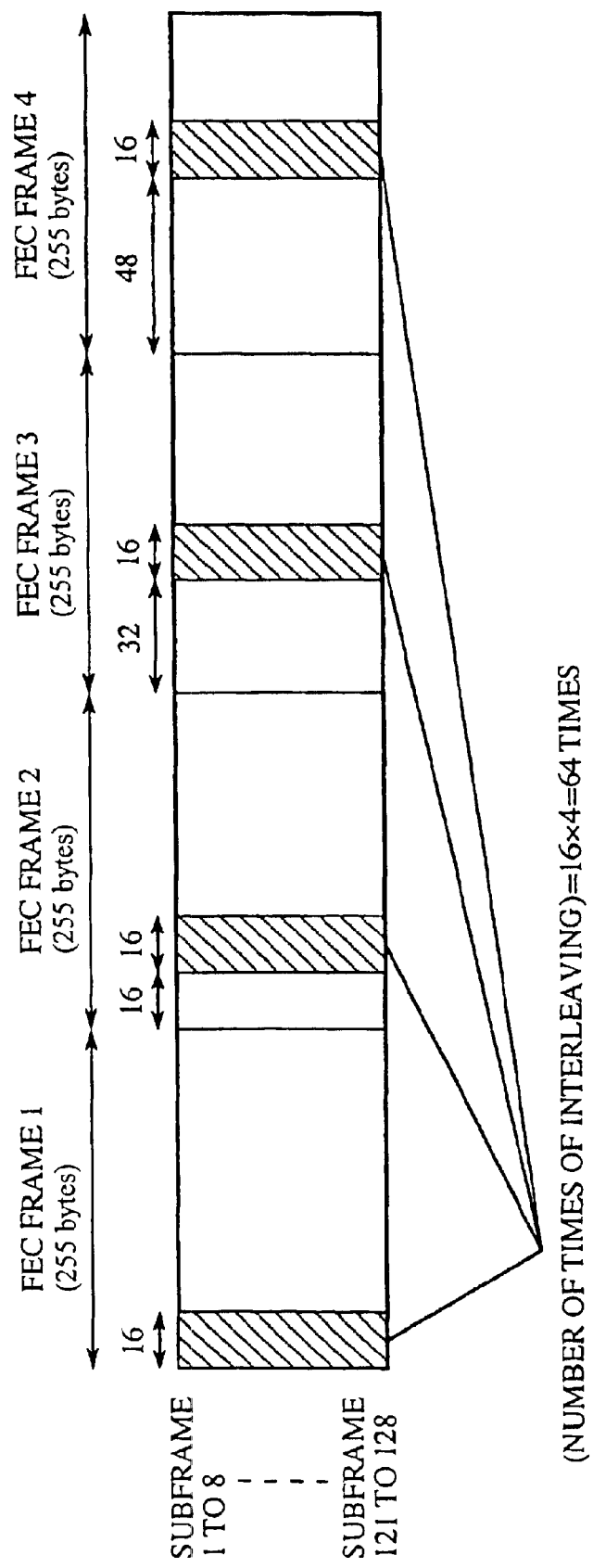
FIG. 10 is a view illustrating an FEC frame structuring method according to a third embodiment of the invention.

FIG. 10 is a view illustrating an FEC frame structuring method according to a third embodiment of the invention. According to this method, with the number k (k=4) of FEC frames set as one interleaving cycle, interleaving is executed by a number of n/m (=128/8=16) times by shifting the information of each FEC frame to be interleaved by 16 bytes, and interleaving is carried out by totally l times (l is larger by k times than n/m; l=16×4=64).

In the foregoing first embodiment, the number of interleaving times l between the two kinds of codes was l=16. However, by setting the number of interleaving times l to be a natural number multiple, e.g., l=32, 48, 64, . . . , it is possible to further enhance the error correction capability while maintaining constant the increase rate of a transmission speed. FIG. 10 shows a case of four FEC frames set as one interleaving cycle. In this case, interleaving is carried out by 16 times by shifting information for interleaving each FEC frame by 16 bytes, and thus interleaving is carried out by totally 64 times, i.e., 16×4=64.

As described above, according to the third embodiment, without changing the basic structure of the FEC frame, and by changing only the first interleaving circuit 32, the first deinterleaving circuit 34, the second interleaving circuit 35, and the second deinterleaving circuit 37 regarding hardware, the error correction capability can be enhanced while the increase data of the transmission speed is maintained constant. As a result, it is possible to build a long-haul and large-capacity optical communication system despite a large degradation amount of optical SNR.

Fourth Embodiment

In the foregoing embodiments, the transmission speed of the FEC frame was 2.86 Gbit/s, and the FEC frame was transmitted through the optical transmission path 24. A plurality of FEC frames may be multiplexed, and the transmission speed of an optical signal passed through the optical transmission path 24 may be set to a×2.86 Gbit/s (a is a given natural number). In addition, the STM-16 data of 2.5 Gbit/s was described as transmission information. However, b pieces of FEC multiplexing and demultiplexing circuits 22 and 26 may be disposed to process the FEC frames of a b type (b is a given natural number), and information may be set as data of b×2.5 Gbit/s (e.g., with b=4, 10 Gbit/s STM-64 data). Moreover, an FEC frame structure similar to that provided by the conventional technology can be applied even for the data of transmission speeds set in accordance with other standards. In this case, speeds are set for the FEC frames corresponding to the data of the transmission speeds set in accordance with the other standards.

Fifth Embodiment

In the foregoing embodiments, the examples of RS (255, 239) and RS (239, 223) represented by Reed-Solomon (RS) codes were taken as the error correction codes. However, for example, RS (255, 239) and RS (239, 207) may be used. In this case, if a code length and an information length of the former RS code are set as p and q, and an information length of the latter RS code is set as r, then RS (p, q) and RS (q, r) may be set, and a bit length of each subframe in the FEC frame may be set to a value corresponding to the values of p, q and r. In addition, the example of the 1 byte of overhead information set for each subframe was described. However, overhead information of 2 or more bytes may be set for each subframe.

As described above, in the FEC frame structuring method and the FEC multiplexer of the present invention, the error correction capability can be greatly enhanced even when the degradation amount of an optical transmission characteristic is increased in the optical transmission system. Thus, the invention is advantageous for realizing long-haul and large-capacity transmission.

What is claimed is:

1. An FEC frame structuring method applied to an optical transmission system, comprising:

a first error correction code generation step of generating first error correction codes by encoding overhead information and transmission information of n (n is a given natural number) subframes in units of m (m is a natural number, and a factor of n) subframes, and adding redundant information for the n/m generated first error correction codes;

an interleaving step of dividing the n subframes encoded in the first error correction codes, and interleaving at least one selected from units of the overhead information and the transmission information, by l times (l is a given natural number);

a second error correction code generation step of generating second error correction codes by encoding the redundant information, and the overhead information and transmission information of the n subframes, which are in the first error correction codes and interleaved in the interleaving step, and adding redundant information for the generated second error correction codes; and an FEC frame generation step of generating an FEC frame by multiplexing the n subframes encoded in the second error correction codes.

2. An FEC frame structuring method according to claim 1, wherein l is n/m.

3. An FEC frame structuring method according to claim 1, wherein l is larger than n/m by k times (k is a given natural number), and with the number k of FEC frames set as one interleaving cycle, interleaving is executed by n/m times for different information of each FEC frame.

4. An FEC frame structuring method according to claim 1, wherein the first and second error correction codes are Reed-Solomon codes respectively represented by RS (q, r) and RS (p, q) (p, q and r are natural numbers, and p>q>r, p representing a code length of the second error correction code, q an information length of the second error correction code, and a code length of the first error correction code, and r an information length of the first error correction code).

5. An FEC frame structuring method applied to an optical transmission system, comprising:

an interleaving step of dividing n (n is a given natural number) subframes in units of m (m is a natural number, and a factor of n), and interleaving at least one selected from overhead information and transmission information in units of n/m subframes by l times (l is a given natural number);

a first error correction code generation step of generating first error correction codes by encoding, for each unit of m subframes, the information composed of the overhead information, and the transmission information in the n subframes interleaved in the interleaving step, and adding redundant information for the generated first error correction codes;

a deinterleaving step of deinterleaving the n subframes encoded in the first error correction codes, by l times, and returning the information interleaved in the interleaving step to the original order;

a second error correction code generation step of generating second error correction codes by encoding the redundant information, the overhead information, and the transmission information in the n subframes, which are in the first error correction codes and deinterleaved in the deinterleaving step, and adding the generated second error correction codes; and an FEC frame generation step of generating an FEC frame by multiplexing the n subframes encoded in the second error correction codes.

6. An FEC frame structuring method according to claim 5, wherein l is n/m.

7. An FEC frame structuring method according to claim 5, wherein l is larger than n/m by k (k is a given natural number) times, and with the number k of FEC frames set as one cycle, interleaving is executed by n/m times for different units of information of each FEC frame.

8. An FEC frame structuring method according to claim 5, wherein the first and second error correction codes are Reed-Solomon codes respectively represented by RS (q, r) and RS (p, q) (p, q and r are natural numbers, and p>q>r, p representing a code length of the second error correction code, q an information length of the second error correction code, and a code length of the first error correction code, and r an information length of the first error correction code).

9. An FEC multiplexer comprising:

first demultiplexing means for demultiplexing transmission information into parallel information;

first speed conversion means for increasing a transmission speed by adding overhead and redundant information regions to the parallel information obtained by the demultiplexing of the first demultiplexing means;

overhead insertion means for inserting overhead information into the overhead information region added by the first speed conversion means;

first interleaving means for changing an order of the parallel information having the overhead information inserted thereinto by the overhead insertion means;

first error correction coding means for generating first error correction codes for the overhead information and the information region of the parallel information, the order thereof having been changed by the first interleaving means, and then storing redundant information of the generated first error correction codes in the redundant information region;

first deinterleaving means for returning the order, changed by the first interleaving means, of the parallel information encoded in the first error correction codes by the first error correction coding means, to the original order;

second error correction coding means for generating second error correction codes for the redundant information, and overhead information and transmission information of the parallel information returned to the original order by the first deinterleaving means, and storing redundant information for the generated second error correction codes in the redundant information region;

first multiplexing means for multiplexing the parallel information encoded in the second error correction codes stored by the second error correction coding means, and generating an FEC frame;

second demultiplexing means for demultiplexing the FEC frame, generated by the first multiplexing means and transmitted through an optical transmission path, into parallel information;

frame alignment means for detecting a head position of the parallel information according to the overhead information stored in the overhead information region of the parallel information obtained by the demultiplexing of the second demultiplexing means, second error correction decoding means for correcting an error of the parallel information by decoding the redundant information of the second error correction codes stored in the redundant information region of the parallel information synchronized by the frame alignment means;

second interleaving means for changing, similarly to that by the first interleaving means, an order of the parallel information error-corrected by the second error correction decoding means;

first error correction decoding means for correcting a residual error of the parallel information by decoding the first error correction codes stored in the redundant information region of the parallel information interleaved by the second interleaving means;

second deinterleaving means for returning the order, changed by the second interleaving means, of the parallel information error-corrected by the first error correction decoding means, to the original order;

overhead separation means for separating overhead information stored in the overhead information region of the parallel information deinterleaved by the second deinterleaving means;

second speed conversion means for reducing a transmission speed by removing the overhead and redundant information regions of the parallel information having the overhead information separated by the overhead separation means; and second multiplexing means for multiplexing the parallel information having the overhead and redundant information regions removed by the second speed conversion means, and outputting transmission information.

10. An FEC multiplexer according to claim 9, wherein the second error correction decoding means, the second interleaving means, the first error correction decoding means, and the second deinterleaving means are connected in a multistage and cascaded manner.

11. A method for generating a forward error correction (FEC) frame including n subframes of transmission data, the n subframes of data being divided into units of m subframes, comprising:

generating a first error correction code for each of the units of m subframes, the first error correction code providing redundant data in connection with the transmission data associated with the unit, wherein the generated first error correction code of the unit includes redundant information;

interleaving the first error correction codes corresponding to the units of m subframes by L times;

generating a second error correction code for each of the units of m subframes by encoding the interleaved first FEC error code corresponding to the unit; and multiplexing the units of m subframes to generate the FEC frame.

12. The method of claim 11, wherein the interleaving step deinterleaves the subframes of transmission data in the first error correction codes, with respect to a prior interleaving performed on the subframes of transmission data before the first error code generating step.

13. The method of claim 11, wherein the first and second error correction codes are Reed-Solomon codes.

14. The method of claim 11, wherein L is n/m.

15. The method of claim 14, wherein the interleaving step interleaves the k-th subframe of transmission data corresponding to each of the m parallel units, k being a placement of the FEC frame within an interleaving cycle of a plurality of FEC frames.

* * * * *